(12) United States Patent
Vincenzoni (10) Patent No.: US 12,301,240 B2
(45) Date of Patent: May 13, 2025

(54) CLOCK GENERATOR CIRCUIT, CORRESPONDING DEVICE AND METHOD

(71) Applicant: STMicroelectronics S.r.l., Agrate Brianza (IT)

(72) Inventor: David Vincenzoni, Arcore (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 49 days.

(21) Appl. No.: 18/326,582

(22) Filed: May 31, 2023

(65) Prior Publication Data

US 2023/0412160 A1 Dec. 21, 2023

(30) Foreign Application Priority Data

Jun. 16, 2022 (IT) .................. 102022000012767

(51) Int. Cl.
*H03K 5/14* (2014.01)
*H03K 19/20* (2006.01)
(Continued)

(52) U.S. Cl.
CPC .............. *H03K 5/14* (2013.01); *H03K 19/20* (2013.01); *H03L 7/0812* (2013.01); *H03K 2005/0015* (2013.01); *H03L 7/0807* (2013.01)

(58) Field of Classification Search
CPC .. H03K 5/14; H03K 19/20; H03K 2005/0015; H03K 5/1565; H03K 3/0315; H03K 3/02; H03K 5/133; H03K 5/135; H03K 5/131; H03K 5/00006; H03K 17/223; H03K 19/00361; H03K 19/1737; H03K 2005/00058; H03K 2005/00104; H03K 2005/00241; H03K 3/037; H03K 5/159; H03K 3/012; H03K 3/0372; H03K 3/0375; H03K 3/356; H03K 3/356165; H03K 3/35625; H03L 7/0812; H03L 7/0807; H03L 7/089; H03L 7/0814; H03L 7/0891; H03L 7/08; H03L 7/0816; H03L 7/18;

(Continued)

(56) References Cited

U.S. PATENT DOCUMENTS 5,463,337 A * 10/1995 Leonowich ........... H03L 7/0816
327/158
6,727,764 B2 * 4/2004 Manku .................. H03L 7/0995
327/158

(Continued)

*Primary Examiner* — John W Poos
(74) *Attorney, Agent, or Firm* — Slater Matsil, LLP (57) ABSTRACT

In an embodiment, a circuit includes cascaded delay units arranged in a chain, each delay unit having an input-to-output delay time, wherein a first delay unit in the chain is configured to receive an input signal for propagating along the delay units in the chain, logic circuitry coupled to delay units in the chain, the logic circuitry configured to generate a clock signal as a logic combination of signals input to and output from the delay units in the chain and feedback circuitry configured to supply to the first delay unit in the chain a feedback signal, the feedback circuitry including a first feedback signal path from a last delay unit in the chain to the first delay unit in the chain and a second feedback signal path from an intermediate delay unit in the chain to the first delay unit in the chain, the intermediate delay unit arranged between the first delay unit in the chain and the last delay unit in the chain.

20 Claims, 5 Drawing Sheets

(51) Int. Cl.
*H03L 7/08* (2006.01)
*H03L 7/081* (2006.01)
*H03K 5/00* (2006.01)

(58) Field of Classification Search
CPC ....... H03L 7/1976; H03L 7/087; H03L 7/091; H03L 7/099; H03L 7/1974; H03L 7/06; H03L 7/0805; H03L 7/081; H03L 7/0818; H03L 7/16; H03L 7/23; H03L 7/235
See application file for complete search history.

(56) References Cited

U.S. PATENT DOCUMENTS

| | | |
|---|---|---|
| 7,675,332 B1 | 3/2010 | Kwasniewski et al. |
| 2004/0257124 A1* | 12/2004 | Araki ...................... H03L 7/235 327/101 |
| 2007/0001771 A1* | 1/2007 | Hori ........................ H03K 5/133 331/57 |
| 2010/0156468 A1* | 6/2010 | Watanabe ............ H03K 3/0315 327/284 |

* cited by examiner

CLOCK GENERATOR CIRCUIT, CORRESPONDING DEVICE AND METHOD

CROSS-REFERENCE TO RELATED APPLICATIONS

This application claims priority to Italian patent application number 102022000012767, filed on Jun. 16, 2022, which application is hereby incorporated herein by reference.

TECHNICAL FIELD

The description relates to clock generators.

BACKGROUND

In digital clock generation, in particular with a ring oscillator, local oscillators that are simple, low-power and low-cost are highly desirable, even if with a moderate precision.

Such oscillators can be implemented using delay elements (delay lines or stages) providing delay-lock-loop (DLL) cells: each delay cell introduces a delay which can be used for the generation of the clock.

Oscillators based on the DLL concept are exposed to the risk that oscillation is undesirably discontinued after a while, due to slightly different delay times for the individual delay cells.

These are mainly due to different delays between rise and fall times, with this behavior leading to a distortion of pulses: the pulses can disappear after a while or can settle to a constant value (e.g., "1").

Stated otherwise, due to different delays introduced by the individual DLL cells for rising and falling signals, the delayed signal becomes distorted and after a while its width decrease to zero (assuming, e.g., Trise>Tfall). This may lead to undesired switch-off of the clock signal.

SUMMARY

One or more embodiments relate to a corresponding device. A clock recovery circuit for use, e.g., in a receiver for use in automated toll payment may be exemplary of such a device.

One or more embodiments relate to a corresponding method.

One or more embodiments relate to clock recovery circuits where data are transmitted over a channel without transmitting a clock signal together with the data.

In a circuit as exemplified herein, the feedback signal for the DLL loop is generated via a flip-flop that is set and reset by pulses generated by DLL cells arranged at the end and in the middle of delay line.

In a circuit as exemplified herein, a clock signal can be generated by a flip-flop that is controlled based on the signal at the end of the chain which sets the flip flop and is reset by a stage located at an intermediate (about halfway, for instance) position of the DLL chain for which the duration of the pulse, namely Tpulse, is more than the delay Td applied by the individual delay cells and less than N*Td, where N is the number of the cells in the DLL delay line.

In a circuit as exemplified herein, clock pulses (clock signal CLK) are generated in a continued manner as long as an enable is asserted. For a stage located at an intermediate (about halfway, for instance) position of the DLL chain the relationships Tpulse<N*Td and Tpulse>Td will apply.

In a circuit as exemplified herein, the period of the clock signal generated is 2*Td, with a signal feed_sig fed to the DLL generator having a stable width as a result of being produced as a function of "set" and "clear" pulse signals clk_set and clk_clr.

A circuit as exemplified herein facilitates generating a clock signal as long as an enable pin is set using a simple arrangement with (very) low power consumption: the clock signal can be activated only in response to a start pulse being set.

A circuit as exemplified herein lends itself to being calibrated, e.g., in order to compensate PVT-induced (PVT=Process, Voltage, Temperature) variations to facilitate obtaining a precise clock.

BRIEF DESCRIPTION OF THE DRAWINGS

One or more embodiments will now be described, by way of example only, with reference to the annexed figures, wherein.

The figures are drawn to clearly illustrate the relevant aspects of the embodiments and are not necessarily drawn to scale.

The edges of features drawn in the figures do not necessarily indicate the termination of the extent of the feature.

Corresponding numerals and symbols in the different figures generally refer to corresponding parts unless otherwise indicated.

Also, throughout this description, a same designation may be used for brevity to designate:
 a certain node or line as well as a signal occurring at that node or line, and
 a certain component as well as an electrical parameter thereof (e.g., the delay provided by a delay element or line).

DETAILED DESCRIPTION OF ILLUSTRATIVE EMBODIMENTS

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Figure 1A:
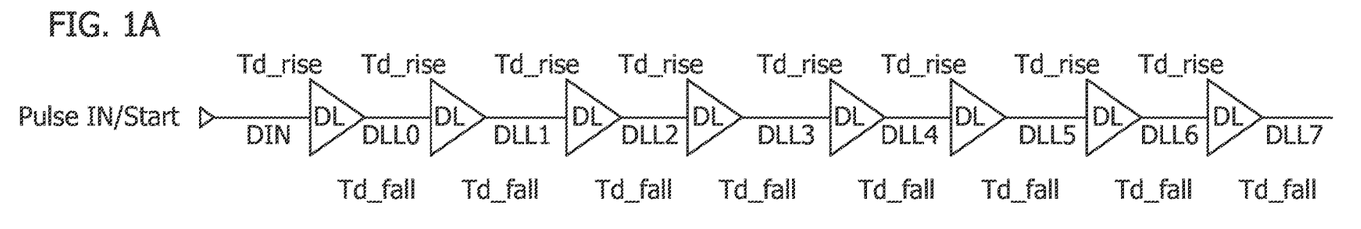
FIG. 1A is generally illustrative of the possibility of using delay lines to provide a clock generator.

FIG. 1A is generally illustrative of the possibility of using a chain of cascaded delay cells (delay stages or elements) DL to provide a clock generator based on a Pulse IN/Start signal supplied as a (pulsed) signal DIN to the first delay cell in the chain.

Figure 1B:
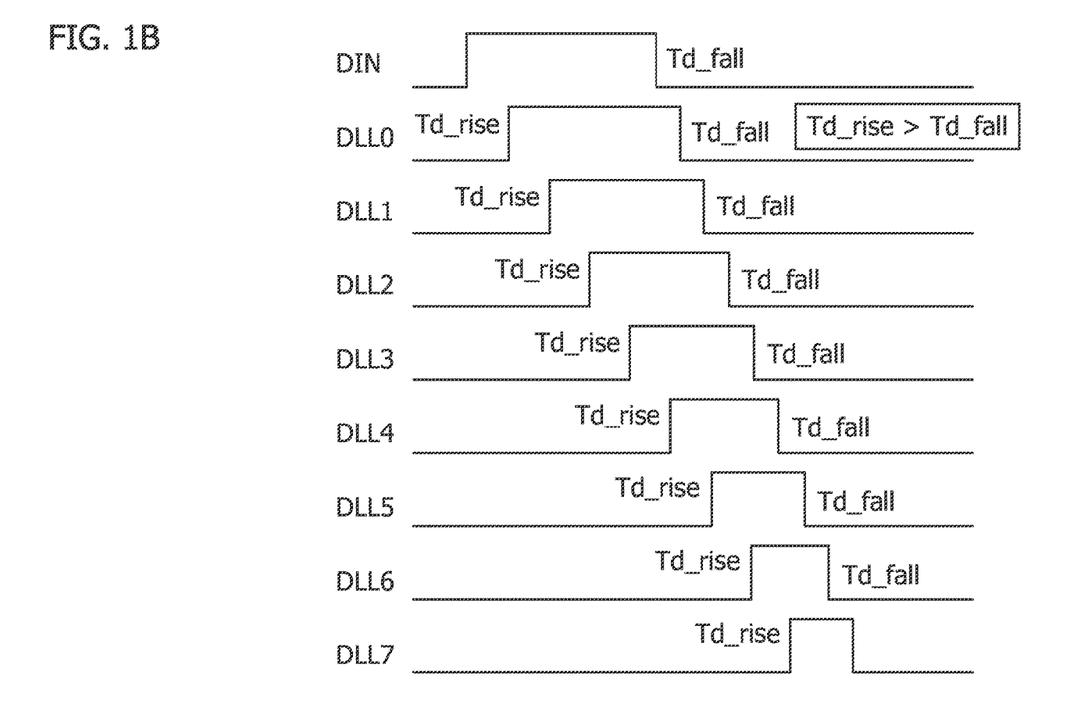
FIG. 1B comprises various diagrams exemplary of signals which may occur in such a delay line.

As illustrated in the diagrams of FIG. 1B, the cells DL in the chain operate with respective rise and fall times Td_rise and Td_fall in producing correspondingly delayed signals DLL0, DLL1, DLL2, DLL3, DLL4, DLL5, DLL6, DLL7. The number N of the cells in the chain (here N=8) is of course merely exemplary.

In order to provide a clock generator, delay cells DL in a chain as illustrated in FIG. 1A are closed in a loop (oftentimes referred to as a delay-lock loop or DLL).

In certain cases, one may observe that operation of such a clock generator may be discontinued after a while.

Even without wishing to be bound to any specific theory in that respect, this phenomenon can be related to the (slightly) different delay times actually provided by each individual delay cell, mainly due to different rise and fall times Td_rise and Td_fall.

By referring to the diagrams of FIG. 1B, if, e.g., Td_rise>Td_fall, each delay cell DL will take longer in switching from "0" to "1" (rising) than in switching back from "1" to "0" (falling). As a result, in addition to being increasing delayed with respect to the signal DIN input to the first delay cell in the chain, the signals DLL0, DLL1, DLL2, DLL3, DLL4, DLL5, DLL6, DLL7 will have an increasingly shorter pulse duration.

Especially in the case of "long" delay chains (N>>1), the pulses expected to propagate along the delay arrangement may disappear after a while or can become set to a fixed value (e.g., "1").

Figure 2:
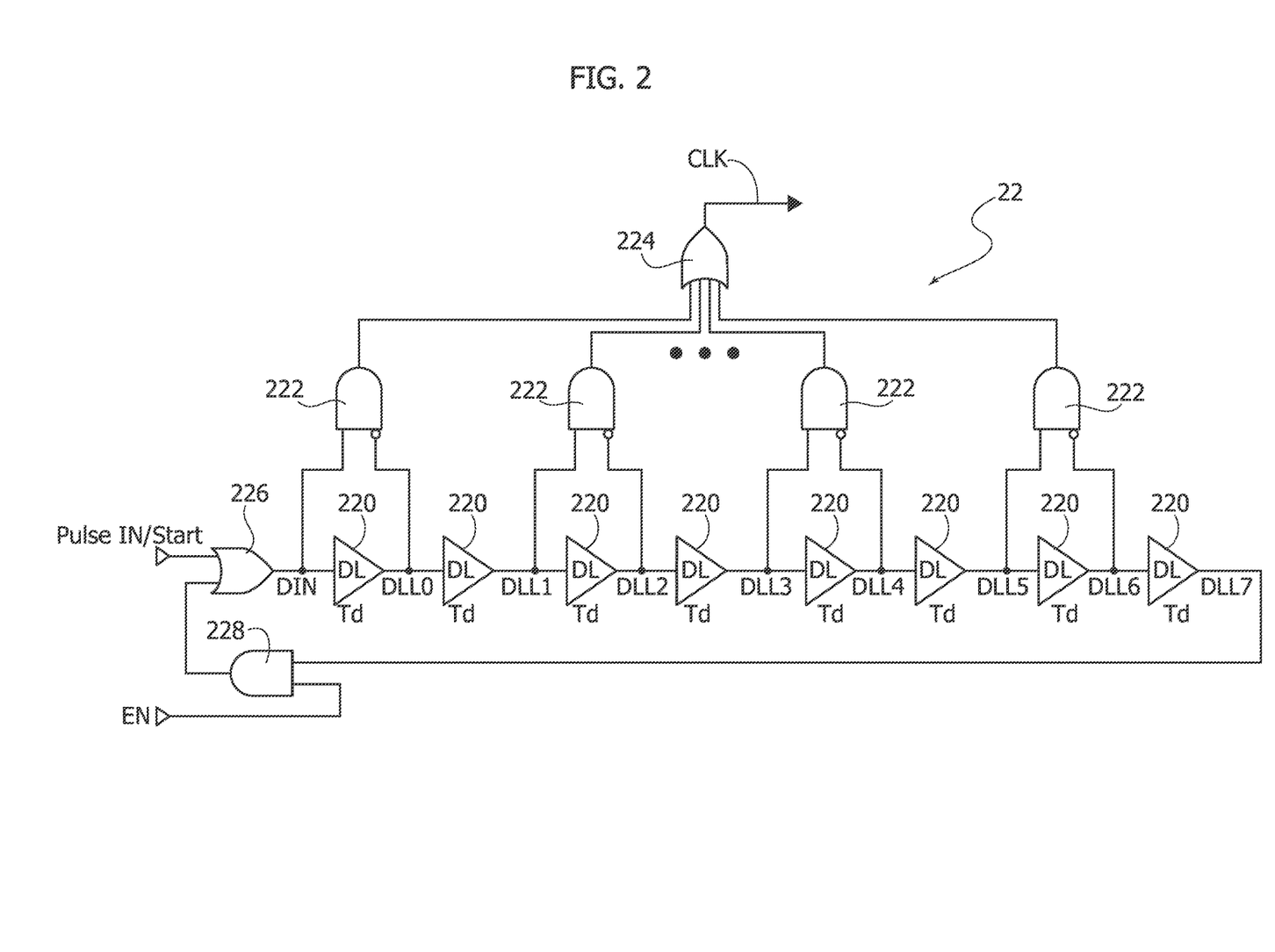
FIG. 2 is a circuit diagram of a clock generator circuit including a plurality of delay lines.

FIG. 2 is a circuit diagram of a (local) oscillator 22 implemented as a delay-locked-loop (DLL) circuit configured to generate a clock signal CLK. The frequency of the generated clock is a function of the delay implemented.

In the implementation illustrated in FIG. 2 (as disclosed in Italian Patent Application No. 102021000027779—David Vincenzoni, inventor, assigned to the same assignee of the present application and not yet available to the public at the time the present application is filed) the delay-locked-loop (DLL) circuit 22 can be implemented as a chain of cascaded delay units 220 configured to apply a respective delay time Td (e.g., 16 ns to 32 ns: of course, these values are merely exemplary and non-limiting). The Italian Patent Application is incorporated herein by reference in its entirety.

A combinatorial logic coupled to the delay units 220 generates a clock signal CLK having a (semi)period that is a function of the delay Td.

As illustrated, the combinatorial logic comprises AND gates 222 coupled to every other delay unit 220 starting from the first to the next-to-last delay unit 220 in the chain (cascade). Each to the AND gates 222 has a first input coupled to the input (DIN, DLL1, DLL3, DLL5, and so on) of an associated delay unit 220 and a second negated input coupled to the output (DLL0, DLL2, DLL4, DLL6, and so on) of the associated delay unit 220.

The outputs of the AND gates 222 are supplied as inputs to an OR gate 224 that produces a clock signal CLK as an output.

That is, the gates 222, 224 provide logic circuitry configured to generate the local clock signal CLK as a function of input signals applied to the delay units 220 in the chain.

As illustrated in FIG. 2, such logic circuitry thus comprises a set of AND gates 222 coupled to alternate ones of the delay units 220 in the chain, wherein each AND gate in the set has a first input coupled to the input (e.g., DIN, DLL1, DLL3, DLL5) of a respective delay unit 220 coupled thereto and a second input coupled to the (inverted) input (e.g., DLL0, DLL2, DLL4, DLL6) to the delay unit following the respective delay unit 220 in the chain.

The OR gate 224 coupled to the outputs of the AND gates thus produces the local clock signal CLK.

In the arrangement illustrated in FIG. 2, an OR gate 226 at the input of the DLL circuit 22 receives:
as a first input, a Pulse IN/Start signal, and
as a second input, the output from an AND gate 228 in turn receiving as inputs the output (here, DLL7) of the last delay unit 220 in the chain/cascade of delay units and an enable signal EN provided in a manner known per se, e.g., via a simple finite state machine (FSM) or a rough data detector (not visible in the figure).

The output from the OR gate 226 at the input of the DLL circuit 22 is applied as the input DIN to the first delay unit 220 in the chain/cascade of delay units.

In the arrangement illustrated in FIG. 2, the Pulse IN/Start signal is a pulse signal having a (notional) "on" time Tpulse and a period between Td (the delay time of the delay units 220) and M*Td, where M is the number of delay units 22 in the chain/cascade of delay units in the DLL circuit.

That is: Tpulse<M*Td AND Tpulse>Td.

For instance, in the example illustrated, M=8 (eight).

The signal Pulse IN/Start can be generated from a Start signal (generated in any manner known to those of skill in the art) via logic circuitry (not visible in FIG. 2) associated with the DLL oscillator 22.

As long as the enable signal EN is active, the clock pulses (signal CLK) are generated continuously with a clock period 2*Td, where Td is the delay time of the delay units 220.

It was noted that, in certain cases, the risk of having an undesirably short pulse at the end of the chain may militate against proper desired operation of a DLL oscillator 22 as illustrated in FIG. 2. In fact, due to a different delay introduced by the cells 220 for rising and falling signal, the delayed signal becomes distorted with its width decreasing towards to zero (assuming Trise>Tfall): see, e.g., the diagrams of FIG. 18. This may even lead to an undesired clock switch-off.

The diagrams of FIG. 1B indicate that pulse "narrowing" (that is, the reduction of the time the pulses DLL0 to DLL7 are "on") increases with the number of the delay cells traversed by the signal. One might thus consider addressing the problem mentioned above by adding an inverter halfway the delay line so that, downstream of the inverter, gradual pulse narrowing would be compensated.

It is noted that this will lead an undesired instability of the oscillation, with the risk that the clock signal CLK may end up by being "stuck" at 0 or 1.

In the example presented in FIG. 3 (where parts or elements like parts or elements already described in connection with the preceding figures are indicated with like references numbers/symbols so that a corresponding description will not be repeated for brevity) the feedback signal feed_sig fed back to the input of the delay chain (OR gate 226)—e.g., via the AND gate 228 for gating by the enable signal EN—is not derived (exclusively) from the end of the chain (output of the last delay cell 220 in the cascade of delay cells).

Figure 3:
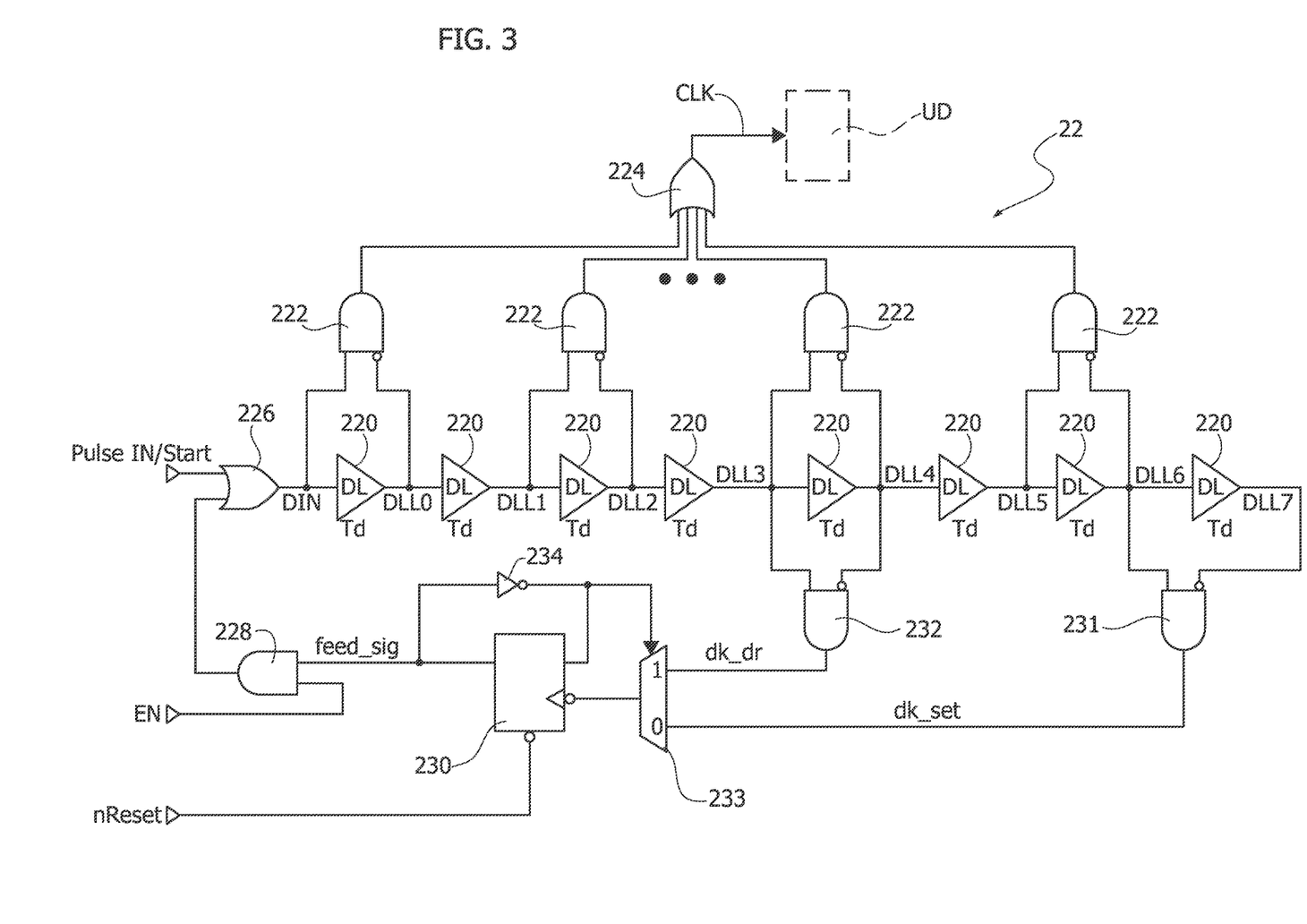
FIG. 3 is a circuit diagram of the clock generator circuit of FIG. 2 including embodiments of the present description.

Like in the case of FIG. 2, in the example presented in FIG. 3 the clock signal CLK (that is adapted to be supplied to a user device UD of any known type, usually a distinct element from the circuit 10) is produced via logic circuitry comprising a set of AND gates 222 coupled to alternate ones of the delay units 220 in the delay unit chain.

As illustrated, each AND gate in the set has a first input coupled to the input (DIN, DLL1, DLL3, DLL5) of a respective delay unit 220 coupled thereto and a second input receiving the—logically inverted—input DLL0, DLL2, DLL4, DLL6 of the delay unit following the respective delay unit 220 in the chain. An OR gate 224 coupled to the outputs of the AND gates 222 produces the clock signal CLK.

It is otherwise noted that the logic circuitry 222, 224 used to produce the clock signal CLK is merely exemplary of one of a plurality of options that can be resorted to by those of skill in the art for that purpose: the embodiments herein are in fact primarily concerned with the feedback network used to counter undesired switch-off of the DLL loop.

In the example presented in FIG. 3, the feedback signal feed_sig is sourced:
at the end of the chain (output of the last delay cell 220 in the cascade of delay cells), and
at (at least) one cell in an intermediate position in the chain.

In the example illustrated in FIG. 3, the cell involved is the fifth cell in the chain (input DLL3 from the fourth cell—output DLL4 to the sixth cell), placed at an intermediate position that is approximately halfway the chain: in the example illustrated in FIG. 3 the chain comprises 8 (eight) cells and 5 (five) is the nearest upper integer to 8/2=4.

In the example illustrated in FIG. 3, the feedback signal feed_sig is generated by a flip-flop 230 that is clocked by pulses generated at the end and intermediate the delay chain.

In the example illustrated in FIG. 3, a first logical signal clk_set is produced by a first AND gate 231 that receives:
as a first input, the signal DLL6 input to the last (here 8th) delay cell 220 in the chain, and
as a second input the (logically inverted) signal DLL7 output from the last delay cell 220 in the chain.

Also, in the example illustrated in FIG. 3, a second logical signal clk_clr is produced by a second AND gate 232 that receives:
as a first input, the signal DLL3 input to an intermediate (here 5$^{th}$) delay cell 220 in the chain, and
as a second input the (logically inverted) signal DLL4 output from the 5$^{th}$ cell 220 in the chain.

The signals clk_set and clk_clr are fed to the inputs of a multiplexer 233 that applies alternately the signals clk_set and clk_clr to the flip-flop 230 in response to the output signal from an inverter 234 whose input is coupled to the output of the flip-flop 230, namely the feedback signal feed_sig.

As illustrated, the flip-flop 230 can be reset via a signal nReset (produced in a manner known per se to those of skilled in the art).

The example illustrated in FIG. 3 effectively counters the risk of having (too) short pulses at the end of the delay chain.

The role of the negated inputs to the gates 231, 232 (and also to the gates 222) in forming the signals clk_set, clk_clr (and CLK) can be notionally equated to an inverter cell placed in the delay chain to act, e.g., on the signal DLL3: that is, such an inverter is "swapped" to other inputs. The feedback circuitry 226, 228, 230, 231, 232, 233 discussed herein thus includes inversion logic in the first feedback signal path (negated input to the gate 231) and in the second feedback signal path (negated input to the gate 232).

To summarize:
the feedback circuitry (namely 226, 228, 230, 231, 232, 233) configured to supply to the first delay unit in the chain of delay units 220 the feedback signal feed_sig, comprises:
i) a first feedback signal path (through the elements 226, 228, 230, 231, 233) from the last delay unit in the chain to the first delay unit in the chain, and
ii) a second feedback signal path (through the elements 226, 228, 23o, 232, 233) from an intermediate delay unit in the chain to the first delay unit in the chain.

The intermediate delay unit is arranged between the first delay unit in the chain and the last delay unit, optionally at least approximately halfway between the first delay unit in the chain and the last delay unit in the chain: an arrangement as illustrated in FIG. 3 comprises N (N=8, for instance) delay units and the intermediate delay unit arranged in a position in the chain counted from the first delay unit which is a nearest integer of N/2.

For instance, with N=8, the intermediate delay unit is the 5$^{th}$ in the chain, with 5 being the nearest (upper) integer of N/2=4.

As illustrated in FIG. 3, the first feedback signal path (through the elements 226, 228, 230, 231, 233) and the second feedback signal path (through the elements 226, 228, 23o, 232, 233) comprise a first feedback branch (e.g., the AND gate 231) coupled to the last delay unit in the chain as well as a second feedback branch (e.g., the AND gate 232) coupled to the intermediate delay unit in the chain.

A common feedback branch through the elements 226, 228, 230, 233 comprise the multiplexer 233 that is coupled to the first feedback branch 231 and to the second feedback branch 232.

The multiplexer 233 is configured to supply to the first delay unit in the chain (here, via the gates 228 and 226) a feedback signal feed_sig based on, alternately:
a first feedback signal component, namely clk_set, received from the last delay unit in the chain via the first feedback branch (AND gate 231), or
a second feedback signal component, namely clk_clr, received from the intermediate delay unit in the chain via the second feedback branch (AND gate 232).

As illustrated, the first AND gate 231 (namely the first feedback branch) and the second AND gate 232 (namely the second feedback branch) receive as a first input and as a second, negated input, respectively:
the input signal DIN as propagated to the input and to the output the last delay unit in the chain,
the input signal DIN propagated to the input and to the output of the intermediate delay unit in the chain.

Figure 4:
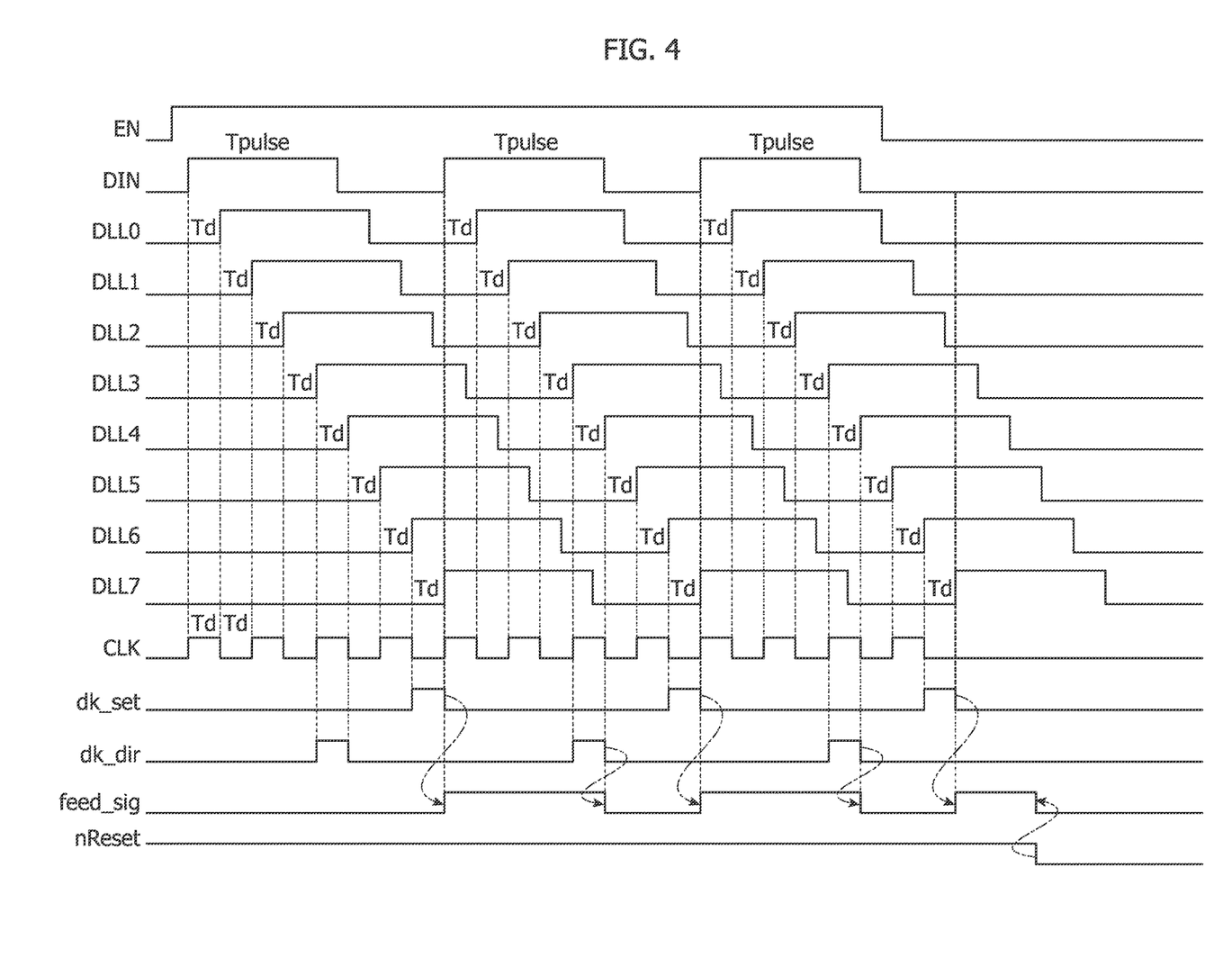
FIG. 4 comprises various diagrams exemplary of the possible time behavior of signals which may occur in a clock generator circuit according to embodiments of the present description.

FIG. 4 comprises various time diagrams sharing a common time (abscissa) scale that are exemplary of possible time behaviours of the following signals (from top to bottom):
the enable signal EN,
the signals, e.g., DIN, DLL0, DLL1, . . . , DLL7 at the inputs/outputs of the delay units 220,
the clock signal CLK (having a period 2×Td),
the signal clk_set,
the signal clk_clr, the signal feed_sig, and
the signal nReset.

As illustrated in FIG. 4, as long as the enable signal EN is active, the clock pulses (CLK) are generated in continuous way with a clock period given by 2*Td.

The feedback signal feed_sig is generated starting from the signals (pulses) clk_set and clk_clr collected both at the end (clk_set) and at an intermediate position (approximately halfway) the delay line (clk_clr), thus facilitating. keeping the width of feed_sig stable.

Figure 5:
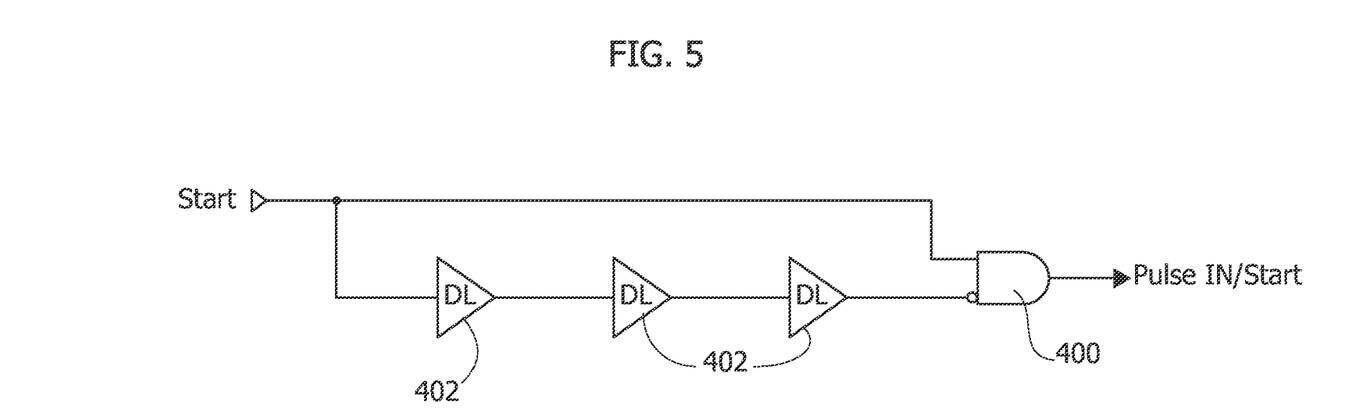
FIGS. 5 and 6 illustrate possible details of implementing a clock generator circuit according to embodiments of the present description.

FIG. 5 is exemplary of a circuit that can be advantageously used to produce the signal Pulse IN/Start from a (general) start signal Start.

As exemplified in FIG. 5 the signal Start is "bifurcated" over a first path and a second path to the first input and a second input of AND gate 400.

The first path is a direct path over which the signal Start is applied directly to the first input of the AND gate 400.

The second path is a path through a set of (e.g., three) delay cells 402 and the signal Start thus delayed is applied to the second input of the AND gate 400 with logical inversion.

Figure 6:
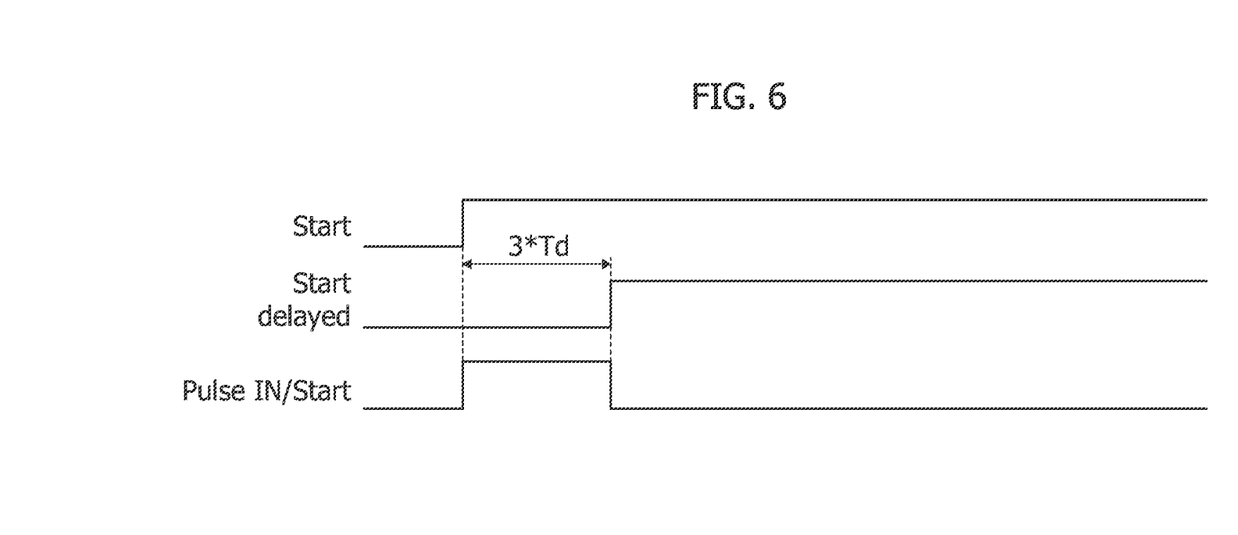

FIG. 6 comprises various time diagrams sharing a common time (abscissa) scale that are exemplary of possible time behaviours of (from top to bottom): the Start signal, the Start signal delayed by the cells 402 and the resulting signal Pulse IN/Start. It is noted that selecting the input-to-output delay time of the cells 402 equal to the input-to-output delay time Td of the delay units 220 results in the pulsed start signal Pulse IN/Start having a duration ("on" time) that is a multiple (e.g., three times) of the input-to-output delay time Td of the delay units 220.

The circuit as per the example illustrated in FIG. 3 is simple and facilitates generating a clock signal in a continuous manner as long as an enable pin is set It is fully digital and has a (very) low power consumption: the clock signal CLK can be activated only if the start pulse is set. The circuit lends itself to be calibrated, e.g., in order to compensate process, voltage, temperature (PVT) variations thus facilitating achieving an increased clock accuracy.

Without prejudice to the underlying principles, the details and the embodiments may vary, even significantly, with respect to what has been described by way of example only without departing from the scope of the embodiments.

What is claimed is:

1. A circuit comprising:
    cascaded delay units arranged in a chain, each delay unit having an input-to-output delay time, wherein a first delay unit in the chain is configured to receive an input signal for propagating along the delay units in the chain;
    logic circuitry coupled to the delay units in the chain, the logic circuitry configured to generate a clock signal as a logic combination of signals input to and output from the delay units in the chain; and
    feedback circuitry configured to supply to the first delay unit in the chain a feedback signal, the feedback circuitry comprising:
        a first feedback signal path from a last delay unit in the chain to the first delay unit in the chain; and
        a second feedback signal path from an intermediate delay unit in the chain to the first delay unit in the chain, the intermediate delay unit arranged between the first delay unit in the chain and the last delay unit in the chain,
    wherein each of the first feedback signal path and the second feedback signal path comprises:
        a first feedback branch coupled to the last delay unit in the chain,
        a second feedback branch coupled to the intermediate delay unit in the chain,
        a common feedback branch comprising a multiplexer coupled to the first feedback branch and to the second feedback branch, the multiplexer configured to supply to the first delay unit in the chain the feedback signal.

2. The circuit of claim 1, wherein the intermediate delay unit in the chain is arranged at least approximately halfway between the first delay unit in the chain and the last delay unit in the chain.

3. The circuit of claim 2, wherein the chain has N delay units, and wherein the intermediate delay unit is located at a position in the chain that is a nearest integer of N/2 from the first delay unit.

4. The circuit of claim 1, wherein the feedback circuitry includes inversion logic in the first feedback signal path and in the second feedback signal path.

5. The circuit of claim 1, wherein the feedback signal is based on, alternately:
    a first feedback signal component received from the last delay unit in the chain via the first feedback branch, or
    a second feedback signal component received from the intermediate delay unit in the chain via the second feedback branch.

6. The circuit of claim 5,
    wherein the first feedback branch comprises a first AND gate configured to receive, as a first input and as a second negated input, the input signal propagated to the input and to the output of the last delay unit in the chain, and
    wherein the second feedback branch comprises a second AND gate configured to receive, as a first input and as a second negated input, the input signal propagated to the input and to the output of the intermediate delay unit in the chain.

7. The circuit of claim 5, wherein the common feedback branch comprises a flip-flop configured to be driven by the multiplexer and configured to produce the feedback signal in response to being clocked, alternately, by the first feedback signal component received from the last delay unit in the chain via the first feedback branch and by the second feedback signal component received from the intermediate delay unit in the chain via the second feedback branch.

8. The circuit of claim 7, wherein the flip-flop is configured to receive as an input the feedback signal after logic inversion.

9. The circuit of claim 1, wherein the feedback signal is based on a first feedback signal component received from the last delay unit in the chain via the first feedback branch.

10. The circuit of claim 1, wherein the feedback signal is based on a second feedback signal component received from the intermediate delay unit in the chain via the second feedback branch.

11. The circuit of claim 1, wherein the feedback circuitry comprises an enable gate configured to facilitate and counter, respectively, forwarding the feedback signal to the first delay unit in the chain based on an enable signal.

12. The circuit of claim 1, further comprising an input gate configured to generate the input signal as a logic sum of the feedback signal with a pulsed start signal, the pulsed start signal having a duration that is a multiple of the input-to-output delay time.

13. The circuit of claim 1, wherein the logic circuitry comprises:

a set of AND gates coupled to alternate ones of the delay units in the chain, wherein each AND gate in the set has a first input coupled to an input of a respective delay unit coupled thereto and a second input coupled to an inverted input of a delay unit following the respective delay unit in the chain, and an OR gate coupled to the outputs of the AND gates in the set of AND gates, the OR gate configured to generate the clock signal.

14. A device comprising:
the circuit according to claim 1; and
a user device coupled to the logic circuitry in the circuit to receive the clock signal therefrom.

15. A circuit comprising:
cascaded delay units arranged in a chain, each delay unit having an input-to-output delay time, wherein a first delay unit in the chain is configured to receive an input signal for propagating along the delay units in the chain;
logic circuitry coupled to the delay units in the chain, the logic circuitry configured to generate a clock signal as a logic combination of signals input to and output from the delay units in the chain; and
feedback circuitry configured to supply to the first delay unit in the chain a feedback signal, the feedback circuitry comprising:
a first feedback signal path from a last delay unit in the chain to the first delay unit in the chain; and
a second feedback signal path from an intermediate delay unit in the chain to the first delay unit in the chain, the intermediate delay unit arranged between the first delay unit in the chain and the last delay unit in the chain,
wherein the chain has N delay units, and
wherein the intermediate delay unit is located at a position in the chain that is a nearest integer of N/2 from the first delay unit.

16. A circuit comprising:
cascaded delay units arranged in a chain, each delay unit having an input-to-output delay time, wherein a first delay unit in the chain is configured to receive an input signal for propagating along the delay units in the chain;
logic circuitry coupled to the delay units in the chain, the logic circuitry configured to generate a clock signal as a logic combination of signals input to and output from the delay units in the chain; and
feedback circuitry configured to supply to the first delay unit in the chain a feedback signal, the feedback circuitry comprising:
a first feedback signal path from a last delay unit in the chain to the first delay unit in the chain; and
a second feedback signal path from an intermediate delay unit in the chain to the first delay unit in the chain, the intermediate delay unit arranged between the first delay unit in the chain and the last delay unit in the chain,
wherein the feedback circuitry comprises an enable gate configured to allow and counter, respectively, forwarding the feedback signal to the first delay unit in the chain based on an enable signal.

17. The circuit of claim 16, wherein the chain has N delay units, and wherein the intermediate delay unit is located at a position in the chain that is a nearest integer of N/2 from the first delay unit.

18. A circuit comprising:
cascaded delay units arranged in a chain, each delay unit having an input-to-output delay time, wherein a first delay unit in the chain is configured to receive an input signal for propagating along the delay units in the chain;
logic circuitry coupled to the delay units in the chain, the logic circuitry configured to generate a clock signal as a logic combination of signals input to and output from the delay units in the chain; and
feedback circuitry configured to supply to the first delay unit in the chain a feedback signal, the feedback circuitry comprising:
a first feedback signal path from a last delay unit in the chain to the first delay unit in the chain; and
a second feedback signal path from an intermediate delay unit in the chain to the first delay unit in the chain, the intermediate delay unit arranged between the first delay unit in the chain and the last delay unit in the chain,
wherein the logic circuitry comprises:
a set of AND gates coupled to alternate ones of the delay units in the chain, wherein each AND gate in the set has a first input coupled to an input of a respective delay unit coupled thereto and a second input coupled to an inverted input of a delay unit following the respective delay unit in the chain, and
an OR gate coupled to the outputs of the AND gates in the set of AND gates, the OR gate configured to generate the clock signal.

19. The circuit of claim 18, wherein the chain has N delay units, and wherein the intermediate delay unit is located at a position in the chain that is a nearest integer of N/2 from the first delay unit.

20. The circuit of claim 18, wherein the feedback circuitry includes inversion logic in the first feedback signal path and in the second feedback signal path.

* * * * *